United States Patent [19]
Motoe

[11] Patent Number: 6,163,279
[45] Date of Patent: *Dec. 19, 2000

[54] KEY INPUT DEVICE

[75] Inventor: Hironori Motoe, Tokyo, Japan

[73] Assignee: Kabushiki Kaisha Toshiba, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/082,381

[22] Filed: May 21, 1998

[30]   Foreign Application Priority Data

May 26, 1997  [JP]  Japan ................................. 9-135295

[51] Int. Cl.⁷ .................................................. H03M 11/00
[52] U.S. Cl. .............................. 341/20; 341/26; 345/168; 345/172; 400/489
[58] Field of Search .................................. 341/22, 20, 21, 341/26, 173; 400/489; 345/168, 172

[56]       References Cited

U.S. PATENT DOCUMENTS 5,739,776  4/1998  Chen ......................................... 341/22
5,826,992  10/1998  Camacho ................................. 341/22
5,859,599  1/1999  Shiga ....................................... 341/22

OTHER PUBLICATIONS

Word Perfect for DOS Manual, Version 5.1, pp. 927 and 928, 1989.

Primary Examiner—Michael Horabik
Assistant Examiner—Albert K. Wong
Attorney, Agent, or Firm—Finnegan, Henderson, Farabow, Garrett & Dunner, L.L.P.

[57]           ABSTRACT

A "Fn" key included in control keys is located adjacent to, for example, a first cursor movement key (for leftward movement) which is located on the right side of a space bar. A second cursor movement key (for rightward movement), a third cursor movement key (for upward movement) and a fourth cursor movement key (for downward movement) are arranged adjacent to the first cursor movement key. The arrangement of some data keys and control keys is adjusted so that the space bar can be situated in a predetermined position in the keyboard. When one of the first through fourth cursor movement keys is depressed with the Fn key depressed, a keyboard controller generates a key code with a control function corresponding to the combination of the depressed keys.

7 Claims, 7 Drawing Sheets

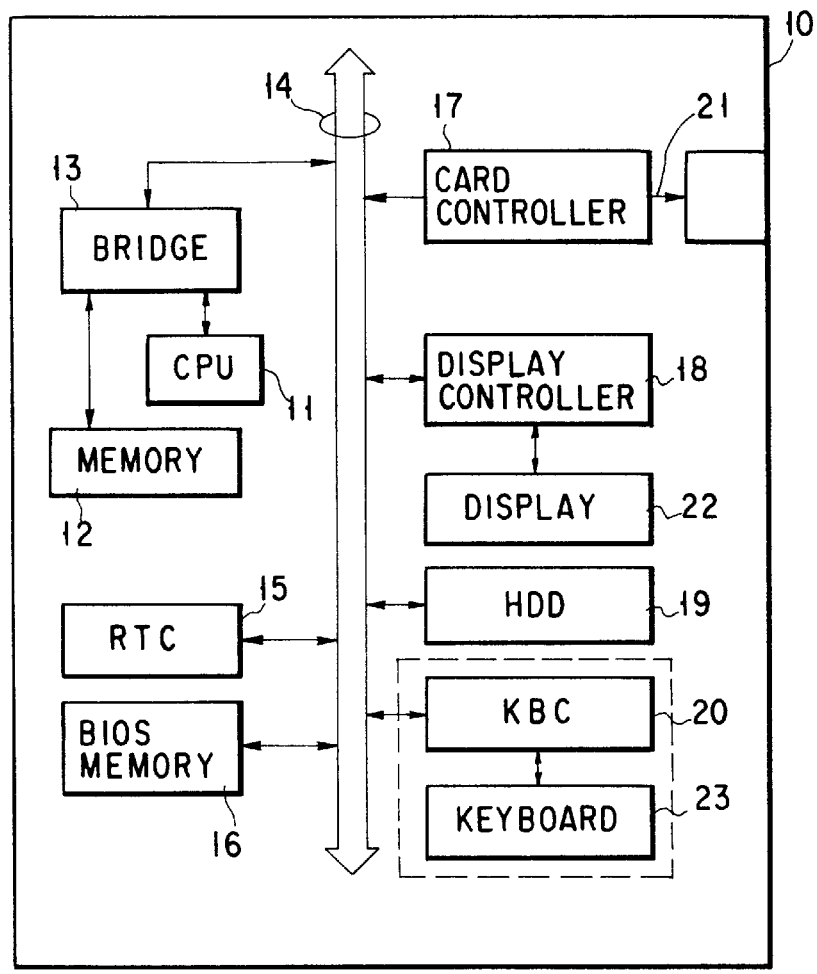
F I G. 4
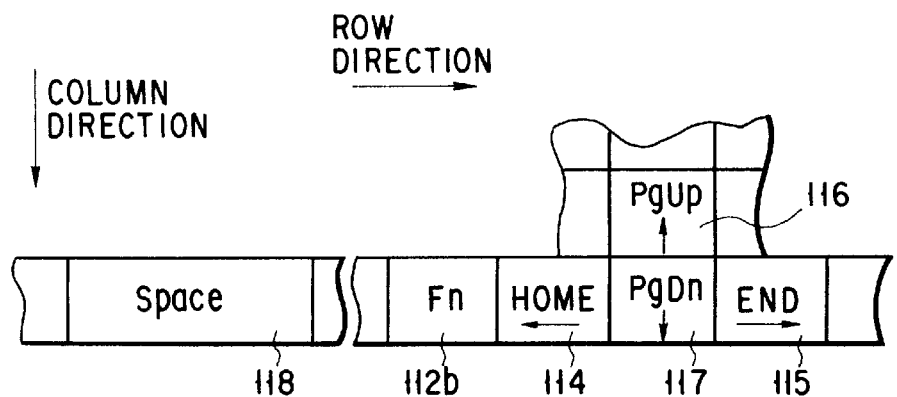
F I G. 7

KEY INPUT DEVICE

BACKGROUND OF THE INVENTION

This invention relates to a key input device applicable to electronic devices such as a personal computer, a word processor, etc., and more particularly to a key input device applicable to highly portable information terminals such as computers of a note book size, of a mini note book size smaller than the note book size, of a palm top size, etc.

The entire contents of Japanese Patent Application No. 9-135295 filed May 26, 1997 are incorporated herein by reference.

FIG. 1 shows an example of a highly portable personal computer with a key input device. In this specification, the key input device includes a keyboard with a plurality of keys and a keyboard controller for outputting a key code corresponding to a depressed key.

In the computer shown in FIG. 1, a keyboard 1 is formed integral with a computer main body 2. The keyboard 1 is electrically connected, via a keyboard controller for outputting a key code corresponding to a depressed key, to internal units built in the main body 2, for example, main unit including a CPU (Central Processing Unit) and peripheral units such as an HDD (Hard Disk Drive), a CD-ROM (Compact Disk Read Only Memory) drive, etc.

The keyboard 1 has substantially rectangular data keys 1a including character keys, numeral keys and code keys, substantially rectangular control keys (hatched keys in FIG. 1) 1b including an "Enter" key, a "Home" key, etc., and function keys 1c for effecting predetermined functions.

The data keys 1a are linearly arranged in rows. The data key rows are arranged in slanted columns such that they deviate from each other at a predetermined pitch in the row direction. The data keys 1a arranged as above are put substantially between the control keys 1b, and a space bar included in the data keys 1a is put between some of the control keys 1b. More specifically, the control keys 1b-1 to 1b-4 indicate the "Home" key with a function for moving the cursor to a leftmost row position, an "End" key with a function for moving the cursor to a rightmost row position, a "PgUp" key with a function for returning the cursor by one page, and a "PgDn" key with a function for advancing the cursor by one page, respectively. The function keys 1c are arranged in the uppermost row of the keyboard 1. Further, the above keys are arranged to meet a predetermined standard such as the ASCII.

FIGS. 2 and 3 show examples of the keyboard 1 with the above-described key arrangement. FIG. 2 shows a key arrangement for USA, while FIG. 3 shows a key arrangement for Europe. The overall key arrangement of each of FIGS. 2 and 3 is similar to that of FIG. 1. However, sign assignments to the data keys 1a slightly differs between FIGS. 2 and 3, since frequency in use of each sign differs among different countries. Furthermore, the length of the space bar differs since the number of data keys 1a differs. In each of the key arrangements, however, the control keys 1b-1 to 1b-4 are arranged at a right end portion of the keyboard.

Recently, more compact and hence more portable personal computers have been developed. In accordance with the development, it is necessary to further reduce the sizes of the keyboard 1 and each key thereof. The size of each key is generally represented by the distance (key pitch) between the center points of adjacent data keys. To meet the recent demand for reduction of the keyboard size, the key pitch may become 13 mm or less if the same number of keys as in the conventional case should be arranged on the keyboard. Where the key pitch is that small, the operability of the keys may well reduce, resulting in erroneous operation of the computer.

BRIEF SUMMARY OF THE INVENTION

It is an object of the invention to provide a key input device with a keyboard of a restricted size which secures a key pitch sufficient to key input.

It is another object of the invention to provide a key input device with a keyboard which has a reduced number of keys arranged in a devised manner, a sufficient key pitch secured due to the reduced number of keys, and sufficient operability and functions realized by the devised arrangement of the keys.

According to an aspect of the present invention, there is provided a key input device applicable to a computer system having a display unit, comprising: a keyboard including a plurality of keys; and a controller connected to the keyboard, for generating a key code corresponding to a depressed one of the keys; wherein the plurality of keys include four cursor movement keys for moving a cursor which appears on the display unit, and an Fn key, and if an area of the keyboard is divided into left-hand and right-hand areas in accordance with a predetermined home position, the Fn key is located in one of the left-hand and right-hand areas, has the four cursor movement keys located.

According to a second aspect of the present invention, there is provided a A key input device comprising: a keyboard including a plurality of keys;

and a controller connected to the keyboard, for generating a key code corresponding to a depressed one of the keys; wherein the plurality of keys include a data key group and a plurality of control keys, the data key group consisting of a plurality of substantially rectangular data keys which are linearly arranged in rows, the rows of the data keys deviate from each other by a predetermined key pitch in a row direction, the plurality of control keys are adjacent to the data key group and having predetermined functions, and at least one of the data keys which is located in a line where a predetermined one of the control keys is located, has a shorter row-directional dimension than other data keys.

According to a third aspect of the present invention, there is provided a key input device comprising: a keyboard including a plurality of keys; and a controller connected to the keyboard, for generating a key code corresponding to a depressed one of the keys, wherein the plurality of keys include a data key group consisting of a plurality of substantially rectangular data keys which are linearly arranged in rows, the rows of the data keys deviate from each other by a predetermined key pitch in a row direction, the data key group includes first and second data keys indicative of a home position for an operator of the key input device; and the first and second data keys and data keys of the data key group, which are located in a same slanted column as each of the first and second data keys, have a shorter row-directional dimension than other data keys.

According to a fourth aspect of the present invention, there is provided a keyboard comprising: four cursor movement keys for moving a cursor which appears on the display unit; and an Fn key, wherein if an area of the keyboard is divided into left-hand and right-hand areas in accordance with a predetermined home position, the Fn key is located in one of the left-hand and right-hand areas, has the four cursor movement keys located.

According to a fifth aspect of the present invention, there is provided a keyboard comprising: a data key group; and a plurality of control keys, wherein the data key group consists of a plurality of substantially rectangular data keys which are linearly arranged in rows, the rows of the data keys deviate from each other by a predetermined key pitch in a row direction, the plurality of control keys are adjacent to the data key group and having predetermined functions, and at least one of the data keys which is located in a line where a predetermined one of the control keys is located, has a shorter row-directional dimension than other data keys.

According to a sixth aspect of the present invention, there is provide keyboard comprising: at least one function key for effecting a predetermined function; at least one control key; and a data key group, wherein the data key group consists of a plurality of substantially rectangular data keys which are linearly arranged in rows, the rows of the data keys deviate from each other by a predetermined key pitch in a row direction, the data key group includes first and second data keys indicative of a home position for an operator of the key input device, and the first and second data keys and data keys of the data key group, which are located in a same slanted column as each of the first and second data keys, have a shorter row-directional dimension than other data keys.

In the present invention, a key pitch sufficient to key input is secured in the compact keyboard. Further, in the key input device of the invention, the key pitch is further increased by reducing the number of keys, and the key arrangement is devised such that the keyboard has sufficient functions even with the reduced number of keys.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4 is a block diagram, showing a computer system to which a key input device according to a first embodiment of the invention is applied;

FIG. 7 is a view, useful in explaining a first feature of the key arrangement shown in FIGS. 5 and 6;

DETAILED DESCRIPTION OF THE INVENTION

The first and second embodiments of the invention will be described with reference to the accompanying drawings.

Figure 1:
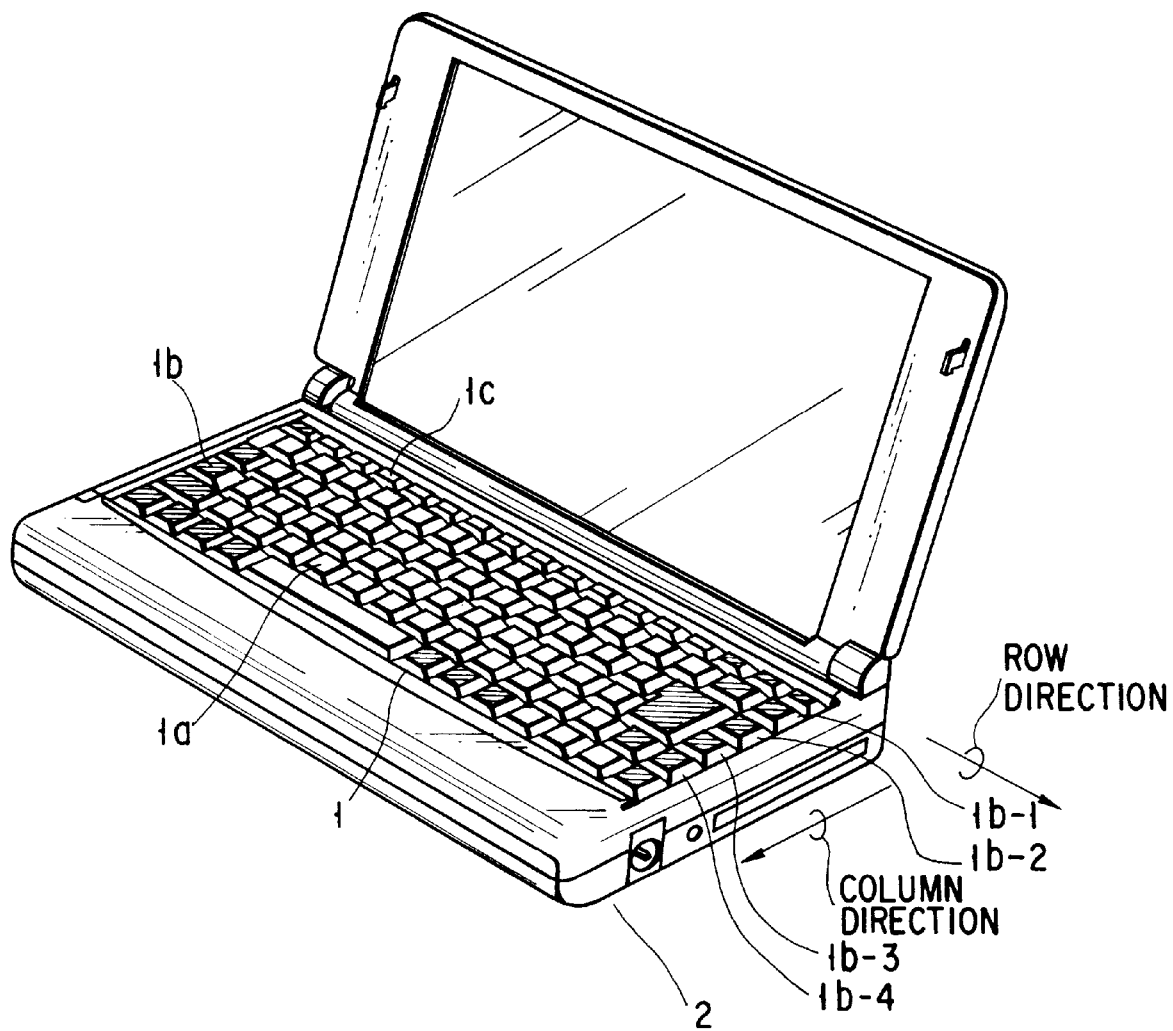
FIG. 1 is an external view showing a conventional portable computer.

FIG. 4 shows a computer system to which a key input device according to a first embodiment of the invention is applied. This computer has the same appearance as that shown in FIG. 1 except for the key arrangement.

A computer main body 10 includes a CPU 11 for controlling the overall main body 10. A memory 12 is connected to the CPU 11 via a bridge 13, and stores programs, data, etc.

The bridge 13 is connected to a system bus 14 for controlling data transfer between the CPU 11, the memory 12 and the system bus 14. The system bus 14 consists of, for example, a PCI bus, and is connected to each structural element of the computer 10. Specifically, the system bus 14 is connected to a real time clock (RTC) 15, a memory 16 which stores a BIOS (basic input/output system), a card controller 17, a display controller 18, a hard disk drive (HDD) 19 and a keyboard controller (KBC) 20.

The real time clock 15 deals with time information on date and time and stores information relating to the system environment. The memory 16 stores the BIOS which is a control program depending upon the hardware. To make the BIOS rewritable, a programmable non-volatile ROM (for example, a flash memory) is applicable.

The card controller 17 is connected to a card slot 21 for controlling data transfer between the system bus 14 and a modem card or a memory card inserted in the card slot 12.

The display controller 18 is connected to a display 22 formed of a CRT, an LCD, etc. for displaying image data on the display 22. The hard disk drive 19 stores data in a hard disk using magnetism. The keyboard controller 20 is connected to a keyboard 21 with a plurality of keys arranged in a manner described later. The keyboard controller 20 generates a key code corresponding to a depressed key and supplies the code to the system bus 14.

As described above, the KBC 20 and the keyboard 23 constitute the key input device in this specification.

The computer system 10 has, for example, a length of 210 mm, a width of 115 mm, and a height of 34 mm (when the system is folded). Further, this system is as light as about 850 g even when it includes a standard battery.

Figure 5:
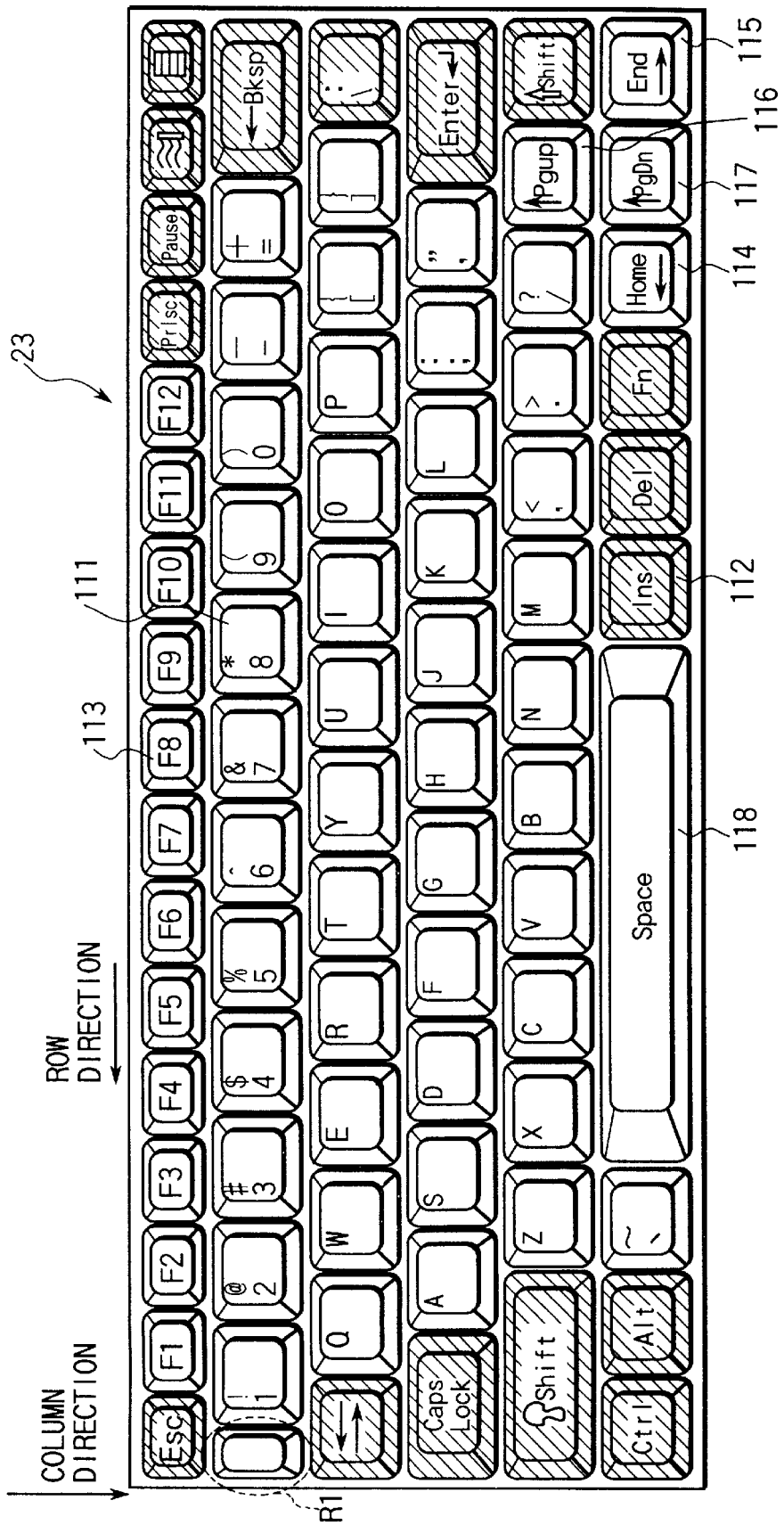
FIG. 5 is a plan view showing the key arrangement of a keyboard for the USA to be applied to the computer system of FIG. 4.
Figure 6:
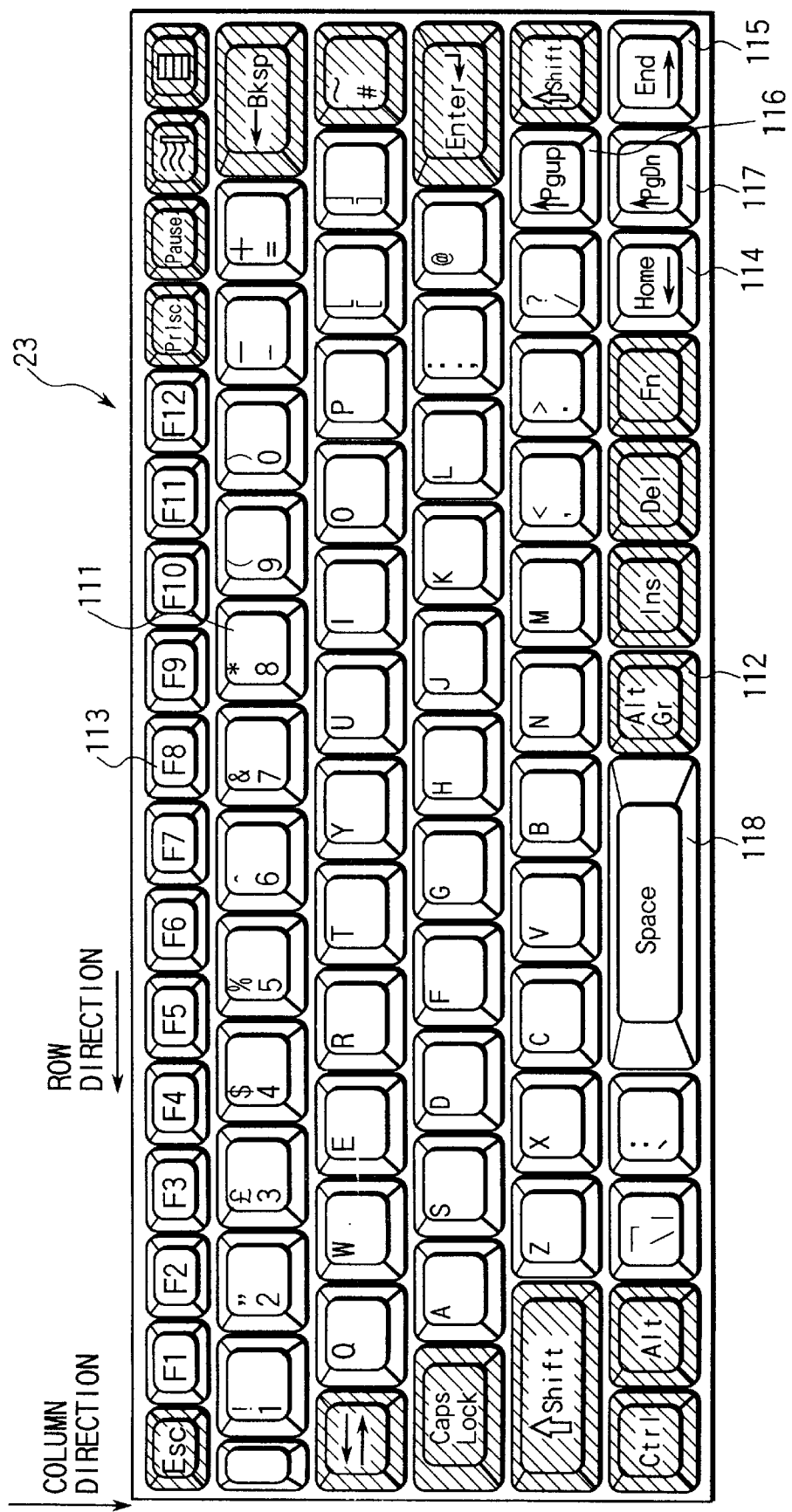
FIG. 6 is a plan view showing the key arrangement of a keyboard for Europe to be applied to the computer system of FIG. 4.

Referring then to FIGS. 5 and 6, key arrangements of the keyboard 23 will be described in detail. FIG. 5 shows a key arrangement for the USA, while FIG. 6 shows that for Europe. Each of the key arrangements has the feature of the invention which will be described below.

As is shown in FIGS. 5 and 6, the keyboard 23 has a plurality of substantially rectangular data keys 111 including character keys, numeral keys, code keys, etc., substantially rectangular control keys (hatched keys in FIGS. 5 and 6) 112 including an "Enter" key, a "Shift" key, etc., and function keys 113 for effecting predetermined functions.

The data keys 111 comprise a plurality of data keys arranged in rows. These data key rows are arranged in slanted columns such that they deviate from each other at predetermined pitches in the row direction (for example, each row deviates from the adjacent upper row by ½ a pitch, ¼ of a pitch and ½ a pitch in this order). The data keys 111 arranged as above are put substantially between the control keys 112, and a space bar 118 included in the data keys 111 is put between some of the control keys 112. Thus, some control keys are in the row closest to the operator (i.e. in the lowest row). The function keys 113 are in the top row. Further, the keys are arranged to meet a predetermined standard such as the ASCII. For example, the key rows are made deviate from each other in a predetermined manner according to the ASCII.

The data keys 111 are selectively arranged in a predetermined order. As mentioned above, the space bar 118 is included in the row closest to the operator.

Cursor movement keys 114–117 are located in the front right corner between the control keys 112.

A first feature of the above key arrangements will be described. The first feature can be easily understood by comparing the conventional key arrangements shown in FIG. 2 and 3 with the key arrangements of the first embodiment shown in FIGS. 5 and 6.

Figure 2:
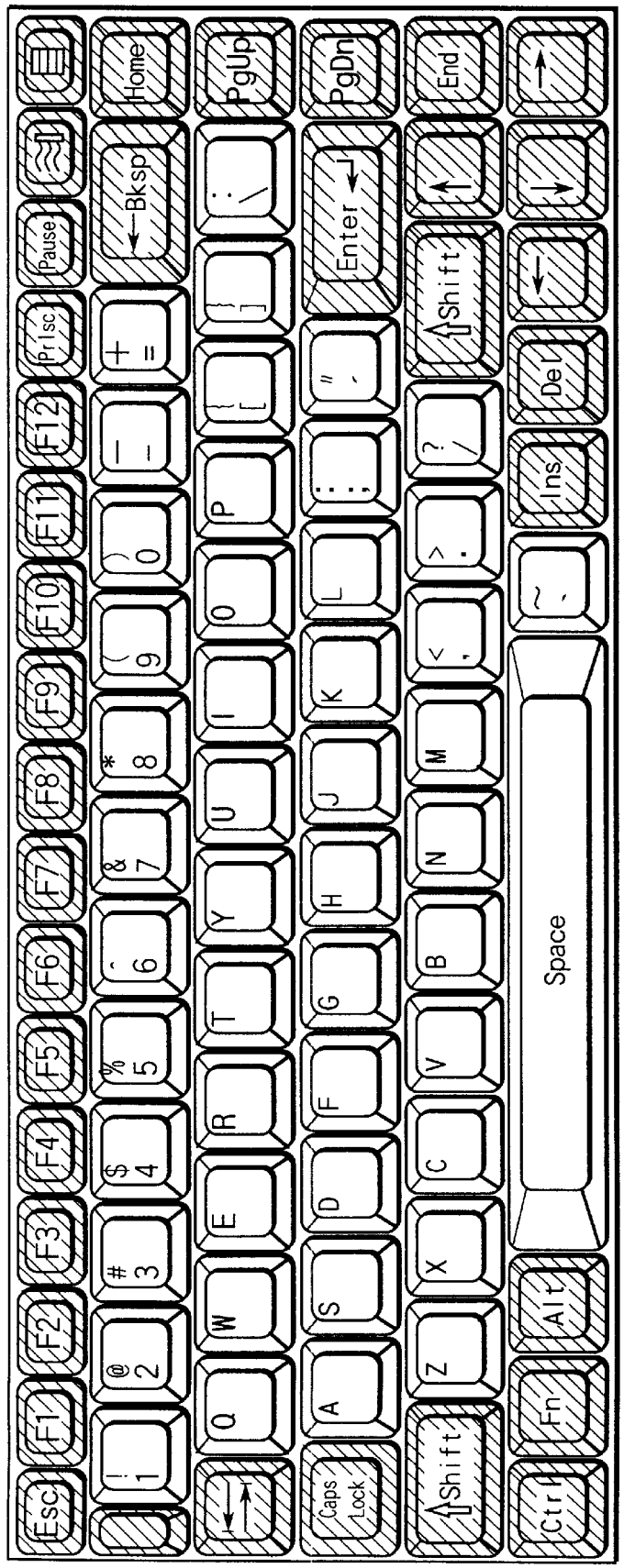
FIG. 2 is a view showing the key arrangement of a conventional keyboard for USA.
Figure 3:
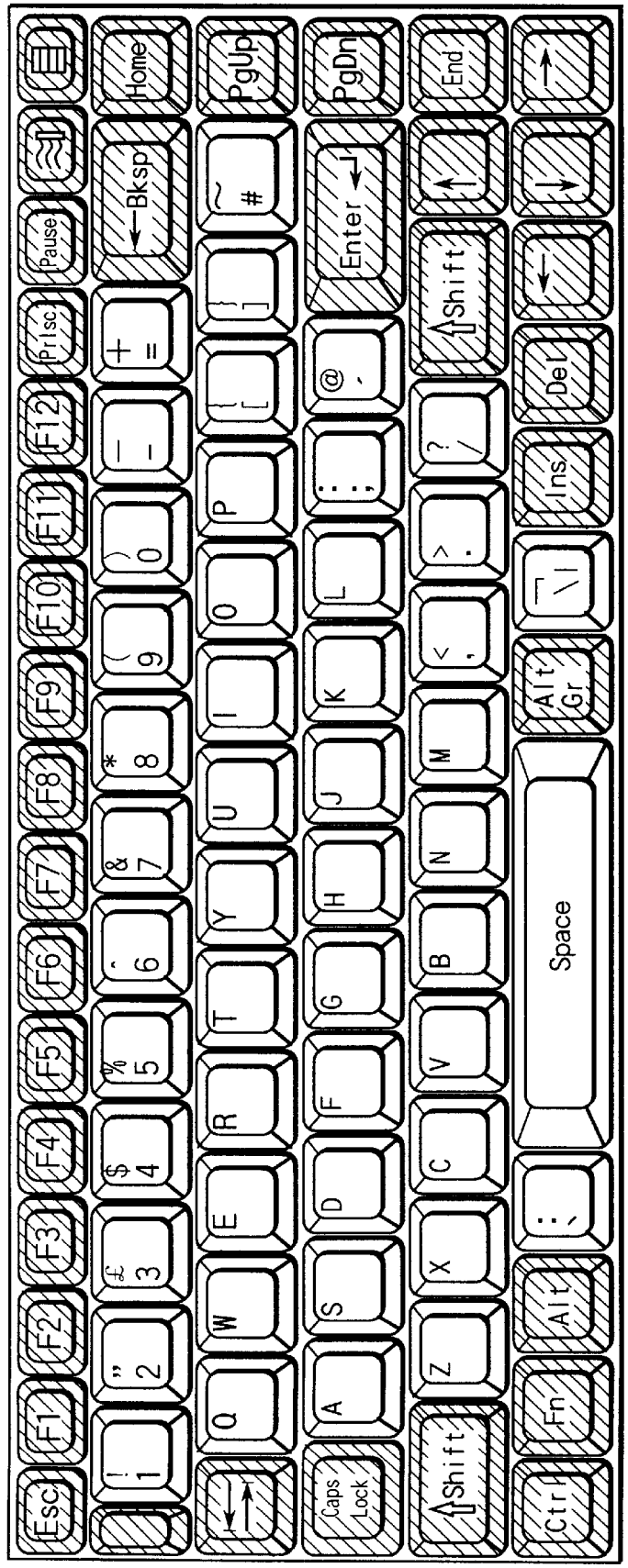
FIG. 3 is a view showing the key arrangement of a conventional keyboard for Europe.

The first embodiment does not use those control keys which are provided in the rightmost column of the keyboard of the conventional personal computer shown in FIGS. 2 and 3, i.e. the "Home" key with a function for moving the cursor to the far left, the "End" key with a function for moving the cursor to the far right, the "PgUp" key with a function for returning the cursor by one page, and the "PgDn" key with a function for advancing the cursor by one page. In the usual keyboard, these keys are situated at locations corresponding to the keys 1b-1–1b-4 in FIGS. 1, 2 and 3. Moreover, in the first embodiment, an "Fn" key 112b included in the control keys 112 is located adjacent to, for example, a first cursor movement key (for moving the cursor leftward) 114 which is located at the right-side of the space bar 118, as is shown in FIGS. 5 and 6 (in the conventional case shown in FIGS. 2 and 3, the "Fn" key is located at the right-side of the space bar). Adjacent to the first cursor movement key 114, second through fourth cursor movement keys (for moving the cursor rightward, upward and downward, respectively) 115 to 117 are provided at locations corresponding to their directions. The important thing is to appropriately adjust the arrangement of the data keys 111 and the control keys 112 so that the space bar 118 can be situated substantially in a predetermined position in the keyboard 23. For this reason, there may be a case where those data keys 111 or control keys 112 which are usually located, for example, on the right side of the space bar 118 should be located on the left side of it. The space bar 118 should be situated substantially in a predetermined position because it is used very often, and the operability of the keyboard may well degrade if its position is greatly changed.

In the above-described key arrangement, the function of each of the control keys which are not employed in this embodiment can be effected by depressing a corresponding one of the first through fourth cursor movement keys 114–117 while the Fn key 112b is depressed. Specifically, when the first cursor movement key 114 is depressed with the Fn key 112b depressed, the keyboard controller 20 generates a function code for moving the cursor to the leftmost row position. Similarly, when the second cursor movement key 115 is depressed with the Fn key 112b depressed, the keyboard controller 20 generates a function code for moving the cursor to the rightmost row position. Further, when the third cursor movement key 116 is depressed with the Fn key 112b depressed, the keyboard controller 20 generates a function code for moving the cursor upward by one page. When the fourth cursor movement key 116 is depressed with the Fn key 112b depressed, the keyboard controller 20 generates a function code for moving the cursor downward by one page. These function codes are output to the bus 14.

Thus, the key input device of the embodiment is constructed such that the key combination of the Fn key 112b and each of the first through fourth cursor movement keys 114–117 enables generation of the function codes for moving the cursor to the rightmost row position, for moving the cursor to the leftmost row position, for moving the cursor upward by one page, and for moving the cursor downward by one page. This means that the operability of the computer does not degrade without the conventional "Home" key, "End" key, "PgUp" key and "PgDn" key, and hence that the key pitch can be set greater to obtain a higher operability than in the conventional case.

Moreover, as described above, in the embodiment, the Fn key 112b is located on the right side of the space bar 118 of a special shape and size, and those data keys 111 or control keys 112 which are usually located, for example, on the right side of the space bar 118 are located on the left side of it. Therefore, a more compact keyboard, which meets the ASCII keyboard arrangement, can be easily made by slightly improving the electric system such as wiring. Since in the embodiment, the Fn key 112b is located on the right side of the space bar 118, the operator can effect the functions of the omitted control keys using two fingers of the right hand, with the main body of the computer held by the left hand. Thus, the operability at the time of effecting the functions of the control keys does not greatly differ from in the conventional computer. Supposing that the keyboard 23 is divided into right-hand and left-hand areas with respect to so-called a home position, to locate the Fn key 112b on the right side of the space bar 118 means to locate this key and the cursor movement keys 114–117 in the same right-hand area of the keyboard 23. In other words, if the cursor movement keys 114–117 are located in the left-hand area of the keyboard 23, it is preferable to provide the Fn key 112b in the same left-hand area.

By virtue of the above-described first feature which enables the omission of the conventional four control keys, the key pitch can be enlarged. To further enlarge the key pitch, a region R1 shown in FIG. 5 is taken into consideration as a second feature. The region R1 is a so-called dead spot wherein no keys can be provided.

The second feature will now be described with reference to FIG. 8.

Figure 8:
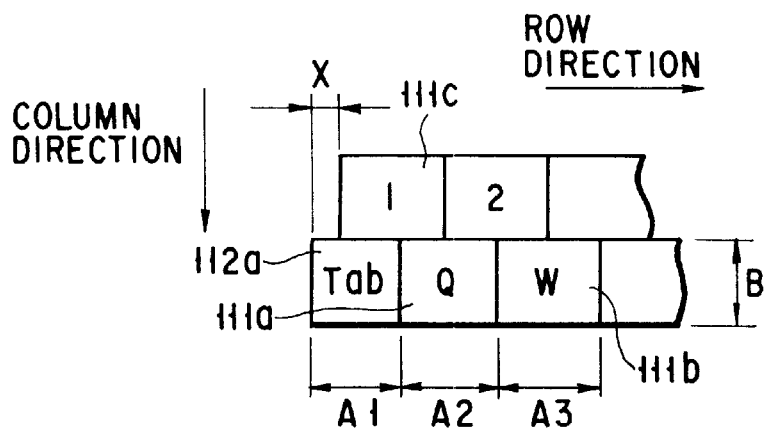
FIG. 8 is a view, useful in explaining a second feature of the key arrangement shown in FIGS. 5 and 6.

As is shown in FIG. 8, a "tab" key 112a included in the control keys 112 is located, for example, at one end of the second row on the basis of the ASCII arrangement. Further, at least one of alphabet keys (A–Z) included in the data keys 111 has a row-directional dimension shorter than the other alphabet keys.

In the first embodiment, the size of each key is set such that A1<A2<A3 is established, where A1 represents the row-directional dimension of the "tab" key 112a, B the column-directional dimension of the "tab" key, A2 the row-directional dimension of a "Q" key 111a adjacent to the "tab" key 112a, and A3 the row-directional dimension of a "W" key 111b adjacent to the "Q" key 111a. The row-directional dimension of a "11" key 11c located in the first row is set at the same value A3 as the "Q" key 111a. Thus, the row-directional dimensions A1 and A2 of the "tab" key 112a and the "IQ" key 111a are set such that a space X between the "1" key 111c and the "tab" key 112a is minimized. Accordingly, the region R1 is minimized. Concerning the column-directional dimension, the "tab" key 112a, the "tab" key 112a and the "W" key 111b are set at the same value.

The region R1 can be minimized by shortening only the row-directional dimension A1 of the "tab" key 112a. However, the frequency in use of the "tab" key 112a depends upon, for example, an application program, and may be high in some cases. In light of such cases, the dimension A1 of the "tab" key 112a is prevented from being extremely shortened, and the shortening of the "Q" key 111a is considered, too.

The sizes of those keys will be more detailed. The (A1×B) size of the "tab" key 112a is set at (13 mm×12 mm) in light of a normal rectangular size of, for example, (15 mm×12 mm). Similarly, the (A2×B) size of the "Q" key 111a is set at (14 mm×12 mm) in light of the normal rectangular size of (15 mm×12 mm). As a result, the space X is reduced, and the row-directional dimension of each of the other data keys 111, control keys 112 and function keys 113 can be increased.

Thus, the dead space defined between the data key rows can be minimized by shortening the row-directional dimension of at least one (i.e. the "Q" key) of the alphabet keys included in the data keys 111. Accordingly, the effective area of the keyboard 23 can be maximized, which means that the other keys can be enlarged with the keyboard 23 kept compact, thereby enhancing the operability of the keyboard.

It should be particularly noted that the frequency in use of the "Q" key 111a, which is located adjacent to the "tab" key 112a, is lower than those of the other data keys 111. In light of this, the row-directional dimension of the "Q" key 111a is shortened together with the "tab" key 112a.

As described above, in the first embodiment, a key pitch sufficient to key input is secured in the compact keyboard. Further, in the first embodiment, the key pitch is further increased by reducing the number of keys, and the key arrangement is devised so that the keyboard can have sufficient functions even with the reduced number of keys.

Figure 9:
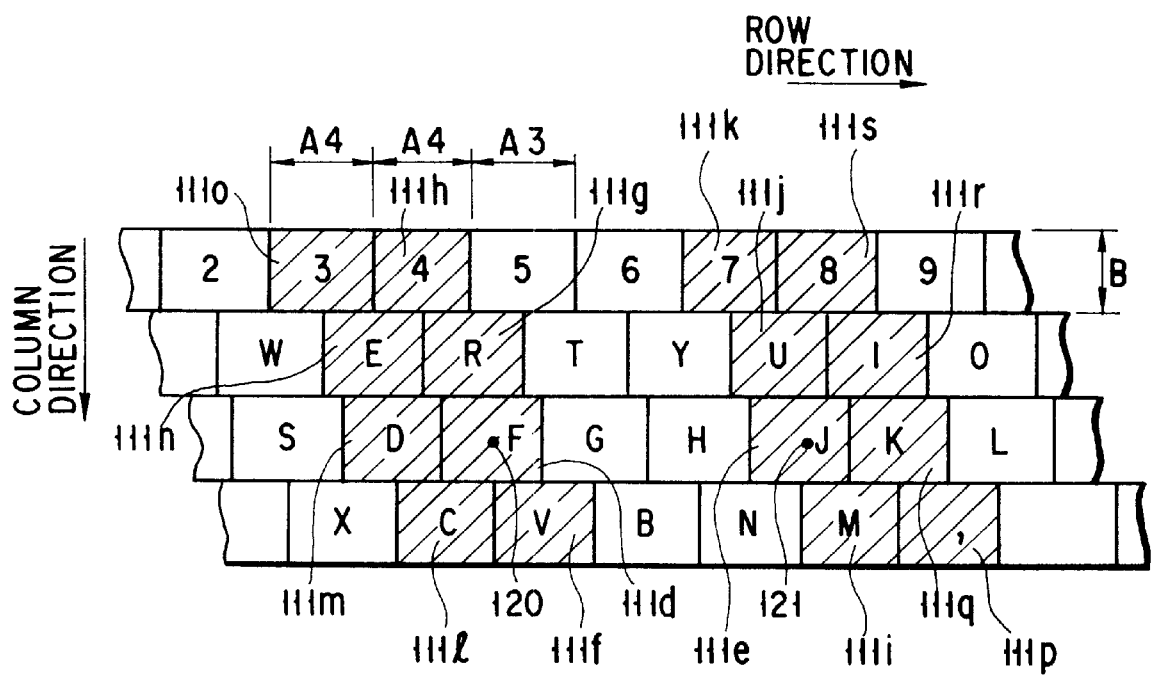
FIG. 9 is a view, useful in explaining a second embodiment of the invention.

Referring then to FIG. 9, an input device according to a second embodiment of the invention will be described. Since the computer system to which the input device of the second embodiment is applied has the same appearance and structure as those shown in FIGS. 1 and 4, no descriptions will be given thereof. The second embodiment is characterized in that those data keys 111 which relate to the home position are taken into consideration.

As is shown in FIG. 9, guide bumps 120 and 121 indicative of the home position for right-hand and left-hand key operations are provided on a "F" key hid and a "J" key 111e, respectively. The operator detects the guide bumps 120 and 121 and places the index finger of the left hand on the guide bumps 120 and the index finger of the right hand on the guide bumps 121, thereby situating all fingers in the so-called home position.

Where both index fingers are situated in the home position, the operator can operate, using the index finger of the left hand, the "F" key 111d, and a "V" key 111f, a "R" key 111g and a "4" key 111h which are arranged in the same slanted column as the "F" key 111d. Similarly, the operator can operate, using the index finger of the right hand, the "J" key 111e, and a "M" key 111i, a "U" key 111j and a "7" key 111k which are arranged in the same slanted column as the "J" key 111e. Further, the operator can operate, using the middle finger of the left hand, a "C" key 111, a "D" key 111m, an "E" key 111n and a "3" key 111d, and operate, using the middle finger of the right hand, a sign key 111p, a "K" key 111q, an "I" key 111r and an "8" key 111s.

The data keys 111d to 111s (hatched keys in FIG. 9) operated by the index and middle fingers of the right and left hands have a row-directional dimension A4 shorter than that A3 of the other data keys.

Setting the data keys 111d–111s operated by the index and middle fingers (which operate keys with greater dexterity) of the right and left hands at a shorter row-directional dimension enables enlargement of the other data keys 111 and the control keys 112 with the effective area of the keyboard 23 minimized, and also enables realization of excellent key operability with few erroneous operations.

Although in the second embodiment, the index fingers of both hands operate the "F" key 111d, the "V" key 111f, the "R" key 111g, the "4" key 111h, the "J" key 111e, the "M" key 111i, the "U" key 111j, and the "7" key 111k, the invention is not limited to this. For example, it can be modified such that the row-directional dimension of a "B" key, a "G" key, a "T" key, a "5" key, an "N" key, an "H" key, a "Y" key, and a "6" key is shortened to enable the index fingers to handle them as well as the above-mentioned keys.

In other words, the index fingers of both hands can operate the data keys 111d to 111k which correspond to the guide bumps 120 and 121 indicative of the home position, and also those data keys 111 which are located adjacent to the keys 111d to 111k, when their row-directional dimension is shortened.

As detailed above, in the invention, a key pitch sufficient to key input is secured in the compact keyboard. Further, in the invention, the key pitch is further increased by reducing the number of keys, and the key arrangement is devised such that the keyboard has sufficient functions even with the reduced number of keys.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A key input device of a computer system, comprising:
a keyboard including a plurality of keys including four cursor movement keys for moving a cursor to the left, right, up, and down by a distance of one character space and a predetermined key for enlarging the distance by which the cursor is moved in response to depression of the cursor movement key; and
a controller connected to the keyboard, for generating a key code corresponding to a depressed key;
wherein functions of moving a cursor to a leftmost position of a row, for moving the cursor to a rightmost position of a row, for returning the cursor by one page, and for advancing the cursor by one page are assigned to said four cursor movement keys without being assigned to exclusive keys and the plurality of keys are divided into left-hand and right-hand key groups, and the predetermined key and the cursor movement key are included in one of the left-hand and right-hand key groups and said controller generates one of first key codes for moving the cursor to the left, right, up, and down, a distance of one character space when any one of the four cursor movement keys is depressed and generates one of second key codes for moving the cursor to a leftmost position of a row, for moving the cursor to a rightmost position of a row, for returning the cursor by one page, and for advancing the cursor by one page when any one of the four cursor movement keys and the predetermined key are depressed.

2. The key input device according to claim 1, wherein the predetermined key is adjacent to one of the four cursor movement keys.

3. A keyboard comprising:
a plurality of keys including four cursor movement keys having a function for moving a cursor to the left, right, up, and down by a distance of one character space and an Fn key for changing the function of the cursor movement keys, wherein functions of moving a cursor to a leftmost position of a row, for moving the cursor to a rightmost position of a row, for returning the cursor by one page, and for advancing the cursor by one page are assigned to the four cursor movement keys without being assigned to exclusive keys and the plurality of keys are divided into left and right key groups, and the cursor movement keys and the Fn key are included in one of the left or right key groups.

4. The keyboard according to claim 3, wherein the Fn key is adjacent to one of the cursor movement keys.

5. The key input device according to claim 1, wherein the predetermined key is an Fn key.

6. The key input device according to claim 1, wherein said predetermined key is located at a position suitable to be depressed by a forefinger and said four cursor movement keys are located at a position suitable to be depressed by a middle finger, third finger, or little finger.

7. The key input device according to claim 3, wherein said Fn key is located at a position suitable to be depressed by a forefinger and said four cursor movement keys are located at position suitable to be depressed by a middle finger, third finger, or little finger.

* * * * *